United States Patent
Baur et al.

(10) Patent No.: US 10,380,868 B2
(45) Date of Patent: Aug. 13, 2019

(54) SENSOR DEVICES

(71) Applicant: Infineon Technologies AG, Neubiberg (DE)

(72) Inventors: Ulrich Johannes Baur, Munich (DE); Franz Jost, Stuttgart (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/247,398

(22) Filed: Aug. 25, 2016

(65) Prior Publication Data

US 2018/0061206 A1 Mar. 1, 2018

(51) Int. Cl.
| | |
|---|---|
| *G01K 3/04* | (2006.01) |
| *G08B 21/18* | (2006.01) |
| *G01K 7/36* | (2006.01) |
| *G01K 15/00* | (2006.01) |
| *G01R 33/09* | (2006.01) |
| *G01R 35/00* | (2006.01) |
| *G08B 29/02* | (2006.01) |

(52) U.S. Cl.
CPC ............ *G08B 21/182* (2013.01); *G01K 3/04* (2013.01); *G01K 7/36* (2013.01); *G01K 15/007* (2013.01); *G01R 33/09* (2013.01); *G01R 35/00* (2013.01); *G08B 29/02* (2013.01)

(58) Field of Classification Search
CPC ...... G08B 21/182; G01K 7/36; G01K 15/007; G01R 33/09; G01R 35/00
USPC .......................................................... 340/514
See application file for complete search history.

(56) References Cited

U.S. PATENT DOCUMENTS

| | | | |
|---|---|---|---|
| 6,510,397 B1 | 1/2003 | Choe | |
| 8,660,735 B2 * | 2/2014 | Tengler | G08G 1/096716 340/988 |
| 8,833,167 B2 | 9/2014 | Reiche et al. | |
| 9,052,240 B2 | 6/2015 | Elke | |
| 2001/0045509 A1 * | 11/2001 | Al-Ali | A61B 5/02427 250/208.1 |
| 2009/0207008 A1 * | 8/2009 | Malis | B60B 3/16 340/438 |
| 2012/0065900 A1 * | 3/2012 | Bradfield | B60L 3/0061 702/34 |
| 2014/0361387 A1 * | 12/2014 | Meyer | H01L 24/19 257/415 |
| 2015/0309127 A1 * | 10/2015 | Ausserlechner | G01R 33/09 324/252 |
| 2016/0025820 A1 | 1/2016 | Scheller et al. | |

FOREIGN PATENT DOCUMENTS

WO 01/58347 A1 8/2001

* cited by examiner

*Primary Examiner* — Kerri L McNally
(74) *Attorney, Agent, or Firm* — Eschweiler & Potashnik, LLC

(57) ABSTRACT

Sensor devices and corresponding methods are provided where a quantity is measured and monitored over time. The quantity may be related to a lifetime of the sensor device.

14 Claims, 5 Drawing Sheets

SENSOR DEVICES

FIELD

The present application relates to sensor devices and to methods for operating such sensor devices.

BACKGROUND

Sensor devices are used in various applications to sense a physical quantity and to output a signal indicative of the sensed quantity. Examples of physical quantities which may be measured with sensor devices include magnetic field, current, temperature, mechanical stress, voltage or pressure, just to give a few examples.

For a specific type of a sensor device, usually operating conditions are specified under which this sensor device operates reliably. For example, a temperature range for normal operation may be given. Nevertheless, even if operated under the specified operating conditions, a lifetime may be specified for the sensors during which the sensor device is expected or guaranteed to operate reliably. When the lifetime is exceeded, reliable operation may no longer be guaranteed. Such reliable operation, on the other hand, is of particular importance for safety critical applications, for example in the automotive field.

SUMMARY

In an embodiment, a device is provided, comprising:
a sensor to measure a physical quantity related to a lifetime of the sensor, and
an evaluation circuit coupled to the sensor to monitor the measured quantity over time to determine if a budget for the quantity is exceeded or about to be exceeded.

In another embodiment, a method is provided comprising: sensing a physical quantity, incrementing a value based on the sensed physical quantity, checking if the incremented value exceeds a threshold, and taking an action depending on the physical quantity exceeding the threshold.

According to yet another embodiment, a device is provided, comprising:
a magnetoresistive sensor arrangement, the magnetoresistive sensor arrangement being configured to output a first value corresponding to a sensed magnetic field and a second value corresponding to a sensed temperature, and
an evaluation circuit to evaluate the sensed temperature over time.

According to yet another embodiment, a device is provided, comprising:
a sensor to measure a quantity related to a lifetime of the device, and
an evaluation circuit coupled to the sensor comprising a storage configured to store the quantity over time.

The above summary is merely intended to give a brief overview of some possible implementations and is not to be construed as limiting. In particular, in other implementations other features than the ones discussed above may be used.

DETAILED DESCRIPTION

Figure 1:
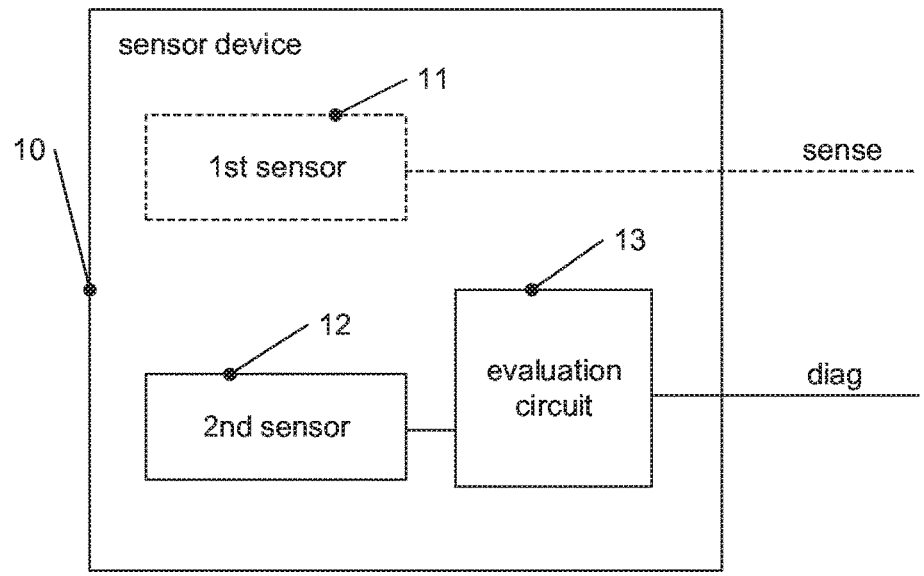
FIG. 1 is a block diagram illustrating a sensor device according to an embodiment.

In the following, various embodiments will be described in detail referring to the attached drawings. These embodiments are to be taken as examples only and are not to be construed as limiting. For example, while embodiments may be described as comprising a plurality of features, elements or details, in other embodiments some of these features, elements or details may be omitted and/or may be replaced by alternative features, elements or details. Furthermore, apart from the features, elements or details explicitly described herein and/or shown in the drawings, other features, elements or details, for example features or elements used in conventional sensor devices, may be provided without leaving the scope of the present application. Features from different embodiments may be combined to form further embodiments. Variations and modifications described with respect to one of the embodiments may also be applied to other embodiments unless noted otherwise.

Any direct electrical connection or coupling between elements shown in the drawings or described herein, i.e. a connection or coupling without additional intervening elements, may be replaced by an indirect connection or coupling, i.e. a connection or coupling comprising one or more additional intervening elements, and vice versa, as long as the general purpose of the connection or coupling, for example to transmit a certain kind of signal or a certain kind of information or to provide a certain kind of control, is essentially maintained. Connections or couplings may be wire-based connections or couplings or wireless connections or couplings (including optical connections for example via glass fibers to transmit signals) unless noted otherwise.

Turning now to the Figures, FIG. 1 schematically illustrates a sensor device 10 according to an embodiment. Sensor device 10 comprises a first sensor 11 to sense a physical quantity to be sensed by sensor device 10. This physical quantity is also referred to as primary quantity herein. The primary quantity may for example be a magnetic field, a pressure, a temperature, an electric current, a voltage, just to give some examples. First sensor 11 measures the primary quantity and outputs a signal sense representing the quantity. First sensor 11 may also perform some preprocessing, like filtering and/or may provide the signal sense according to a particular communication protocol. First sensor 11 may also comprise a plurality of individual sensor elements for example to provide redundancy in sensing the primary quantity. The operation of first sensor 11 and outputting signal sense may correspond to a conventional operation of a sensor device, and any conventional techniques may be employed.

In a particular implementation, first sensor 11 may be a magnetic field sensor using magnetoresistive elements. Magnetoresistive elements are elements which change their electrical resistance based on a magnetic field at the magnetoresistive elements. Examples for such magnetoresistive elements include elements using giant magnetoresistance (GMR), anisotropic magnetoresistance (AMR), tunneling magnetoresistance (TMR) or colossal magnetoresistance (CMR), collectively referred to as XMR.

Furthermore, sensor device 10 of FIG. 1 comprises a second sensor 12 to sense a secondary quantity. In some embodiments, the secondary quantity is a quantity influencing a lifetime of sensor device 10. For example, second sensor 12 may be a temperature sensor measuring a temperature of sensor device 10. In other implementations, second sensor 12 may be a stress sensor, a current sensor or any other sensor measuring a quantity influencing the lifetime of sensor device 10. This is to say that this quantity influences the lifetime of first sensor 11, second sensor 12, evaluation circuit 13, and/or the sensor device 10 as a whole. A situation where the quantity influences sensor device 10 as such would be for example any circumstances affecting a package of the sensor device 10, but is not limited thereto.

In some implementations, second sensor 12 may be implemented jointly with first sensor 11 and/or may use similar elements for sensing the second quantity as used by first sensor 11 to measure the primary quantity. For example, in an embodiment where second sensor 12 measures a temperature, and first sensor 11 measures a magnetic field, both sensors may be based on XMR elements. Second sensor 12 then uses that XMR elements not only change their resistance with varying magnetic fields, but the resistance is also temperature-dependent, such that the temperature may be measured. This allows implementation of first sensor 11 and second sensor 12 in a joint process flow, for example joint deposition of magnetoresistive layers, in some embodiments. For example, as will be explained later with respect to FIG. 7, XMR elements may be arranged and read out such that the read-out depends only on temperature but essentially not on the magnetic field, or only on the magnetic field and essentially not on temperature, such that the magnetic field and temperature may be measured separately.

In yet other embodiments, the first sensor 11 and second sensor 12 may be implemented as a single sensor, for example in cases where the primary quantity is the same as the secondary quantity, this is to say both first sensor 11 and second sensor 12 may be measuring for example temperature. In this case, the first sensor may be omitted, as indicated by dashed lines in FIG. 1. Alternatively different quantities are measured with the same sensor In such a setup the first quantity may be a temperature, and the second quantity is a magnetic field. It is to be understood that both setups may be implemented using XMR structures, as will be explained later referring to FIGS. 2B and 7.

Second sensor 12 is coupled to an evaluation circuit 13 in the embodiment of FIG. 1. Evaluation circuit 13 evaluates the secondary quantity over time and evaluates if a budget for the secondary quantity is about to be reached or already reached. For example, if the secondary quantity is temperature, sensor device 10 may have a thermal budget in terms of temperature exposure over time. When the thermal budget is exceeded, functioning of sensor device 10 may no longer be guaranteed. For example, exceeding the temperature budget may lead to delamination in sensor device 10, i.e. separation of components from each other. This may adversely affect functioning, or humidity may enter gaps caused by the delamination, which may lead to corrosion or ion migration again adversely affecting functioning of device 10. In other words the temperature budget approximates an integration of the (secondary) quantity over time (life-time or time of operation).

To this end, in some embodiments evaluation circuit 13 may store the secondary quantity over time, so that a complete history of the secondary quantity over time is available for analysis for example for service personnel for various kinds of analysis by reading out the history via an interface. Such an analysis may for example comprise the above comparison with a budget or also a detection of events where the secondary quantity exceeds a specified operating range for sensor device 10 (e.g. overtemperature or overcurrent). In other embodiments, the secondary quantity may be accumulated or integrated over time and compared to the budget. In embodiments, such an accumulation requires less memory that the storing of the complete history. In yet other embodiments, the two approaches may be combined.

In a similar manner, for example a stress budget over time or also a current budget over time may be provided. For example, an exceeded stress budget may indicate a likelihood that the mechanical integrity of the sensor device may be compromised. A current budget is an indirect indication of an energy budget and may indicate ageing of electronic components (e.g. sensors) of the sensor device.

In some embodiment evaluation circuit 13 may check if the respective budget is about to be exceeded or even exceeded and outputs a corresponding diagnosis signal diag. Based on the diagnosis signal, appropriate measures may be taken, like warning a user that sensor device 10 is to be replaced or even disabling some functions for which correct operation of sensor device 10 is critical, depending on a situation. Examples for measuring such a budget will be given later referring to FIGS. 5 and 6.

In some embodiments, evaluation circuit 13 may comprise a storage where the secondary quantity is accumulated over time, for example by incrementing a stored value by a current measurement value of the secondary quantity in regular or irregular intervals, which would give again an approximation of an integral of the secondary quantity over (life-)time. In other embodiments, as mentioned above, a complete history of the secondary quantity may be stored. In some embodiments, such a storage may comprise an electrically erasable programmable read-only memory (EE-PROM) or a flash memory, but is not limited thereto. The thus accumulated value may then be compared to one or more threshold values.

It should be noted that in embodiments for the above monitoring performed by second sensor 12 and evaluation circuit 13 an exceeding of the budget does not necessarily imply that sensor device has been operated outside a specified range, for example outside a specified temperature range. Even when operated within a specified temperature range, sensor device 10 may have a limited guaranteed lifetime (corresponding to a limited thermal budget), which may be reached faster if for example sensor device 10 is operated more at the upper limit of the specified temperature range than for a sensor device 10 operated closer to the lower limit of the temperature range.

Sensor device 10 may be provided on a single chip, and/or may be integrated in a single package, such that evaluation circuit 13 is provided within the sensor device, as shown in FIG. 1. In other embodiments, evaluation circuit 13 may be external to the sensor device. An example for such an embodiment is illustrated in FIG. 2A.

Figure 2A:
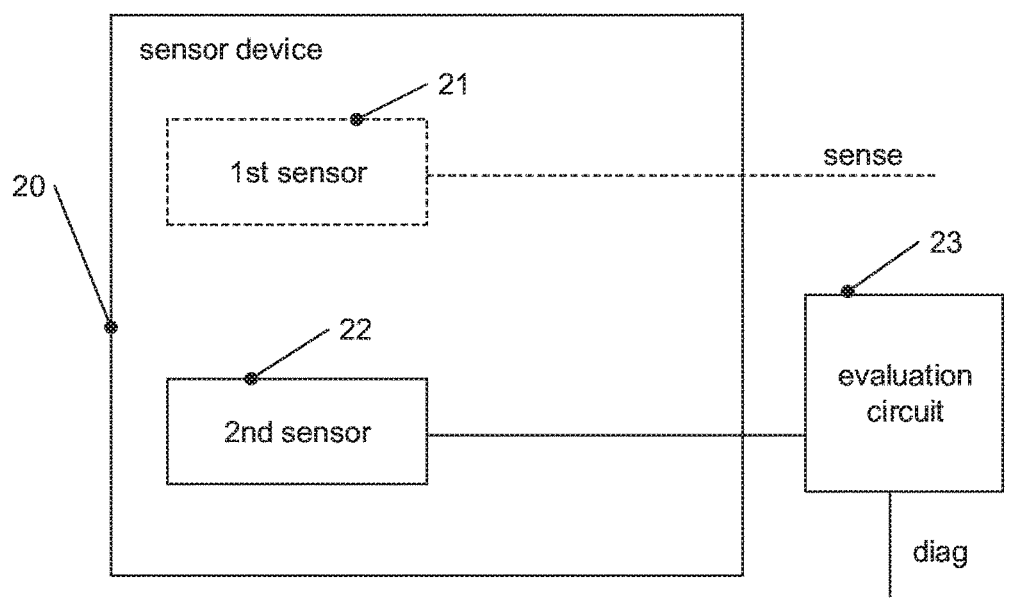
FIG. 2A is a block diagram illustrating a sensor device according to another embodiment.

FIG. 2A illustrates a sensor device 20 according to an embodiment. Sensor device 20 comprises a first sensor 21 for sensing a primary quantity and output a signal sense, and a second sensor 22 for measuring secondary quantity. First sensor 21 and second sensor 22 may be implemented as described for first sensor 11 and second sensor 12 of FIG. 1, and variations and alternatives described in this respect for first sensor 11 and second sensor 12 of FIG. 1 are also applicable to first sensor 21 and second sensor 22 of FIG. 2A.

Furthermore, the embodiment of FIG. 2A comprises an evaluation circuit 23 external to sensor device 20 which receives an output signal from second sensor 22 and outputs a diagnosis signal diag in response thereto. Apart from being provided outside sensor device 20 (for example outside a package of sensor device 20), operation of an evaluation circuit 23 may correspond to operation of evaluation circuit 13 of FIG. 1. In some embodiments, evaluation circuit 23 may provide additional functions, like outputting a warning signal to a user or otherwise controlling an environment (e.g. parts of an automobile) where sensor device 20 is provided.

Figure 2B:
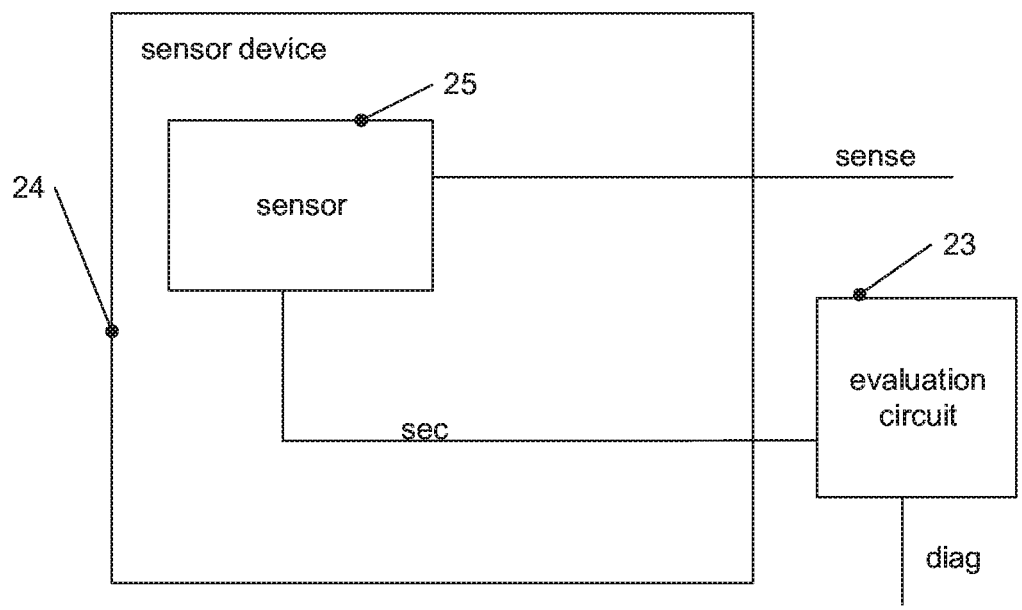
FIG. 2B shows a sensor device according to a further embodiment.

As already mentioned, in other embodiments a single sensor may be used. FIG. 2B illustrates an example for a sensor device 24 according to such an embodiment. In the embodiment of FIG. 2B, sensor device 24 comprises a single sensor 25, which is configured measure to both a primary quantity, say a magnetic field, and a secondary quantity, say a temperature. A signal sense representing the primary quantity is output by sensor device 24, and a signal sec representing the secondary quantity is provided by the sensor 25 to evaluation circuit 23, which may correspond to evaluation circuit 23 of FIG. 2A. Instead of the external evaluation circuit 23, also for the embodiment of FIG. 2B in a different implementation an internal evaluation circuit like evaluation circuit 13 of FIG. 1 may be provided. In some embodiments, the primary quantity may be the same as the secondary quantity, for example temperature.

In other embodiments, the primary quantity may be different from the secondary quantity. Such a sensor sensing a primary quantity and a secondary quantity different from the first quantity may for example be implemented using XMR sensor elements. In this case the primary quantity may be a magnetic quantity such as strength or direction, and the secondary quantity may be a temperature. An example sensor implementation is illustrated in FIG. 7 and described below.

As can be seen from FIGS. 1, 2A and 2B, different sensor arrangements, either with separate sensors or with a single sensor, and an internal or external evaluation circuit 13, 23 may be used to measure the primary quantity and the secondary quantity.

Figure 7:
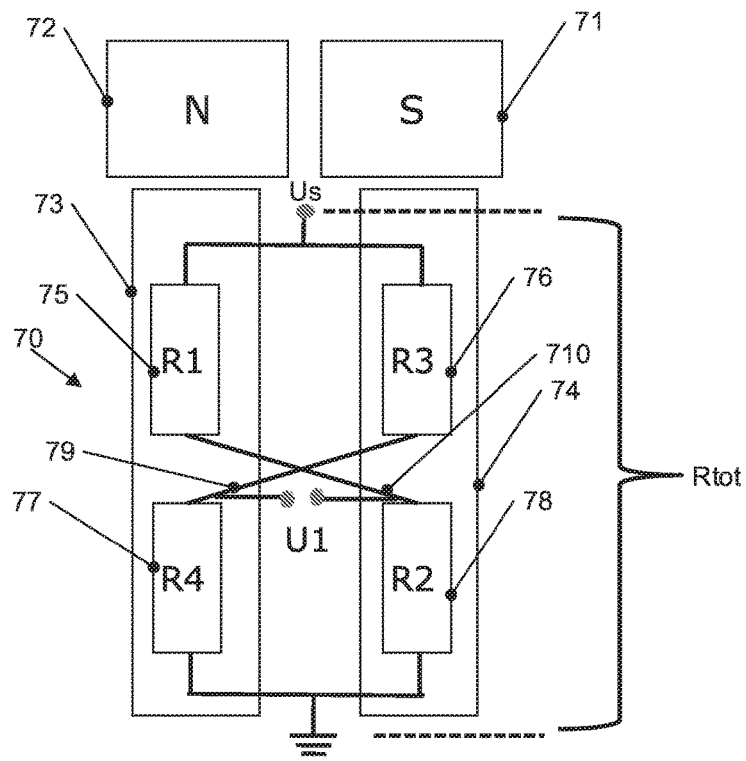
FIG. 7 shows a particular implementation of a sensor according to an embodiment.
Figure 7:
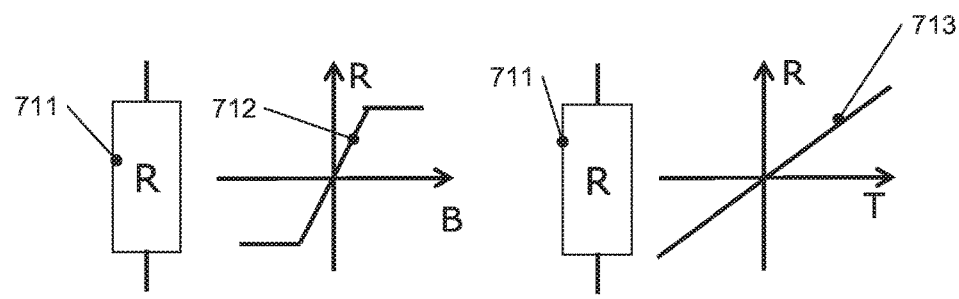

FIG. 7 illustrates a sensor 70 comprising four magnetoresistive elements 75, 76, 77 and 78 which are coupled in form of a wheatstone bridge. Sensor 70 is coupled between a supply voltage Us and ground. Magnetoresistive elements 75 to 78 each change their resistance with temperature and with changing magnetic field and may for example be GMR elements, but are not limited thereto.

This change is illustrated in a lower part of FIG. 7, for a generic magnetoresistive element 711 representing any one of magnetoresistive elements 75 to 78. A curve 712 schematically shows the dependency of the resistance R on a magnetic field B, and a curve 713 schematically shows a variation of resistance R over temperature T. Both curves 712 and 713 are schematic only and given in arbitrary units for resistance, magnetic field and temperature.

In sensor device 70, magnetoresistive elements 75 to 78 are for example designed to have equal resistance when no magnetic field is applied, as is a typical setup for wheatstone bridges known in the art. For a vanishing magnetic field a voltage U1 tapped between nodes 79, 710 is zero.

Furthermore, the resistors of FIG. 7 are provided with a polarity and designed such that with increasing magnetic field a resistance of element 75, 77 (collectively designated by a box 73) decreases, while a resistance of elements 76, 78 (collectively designated by a box 74) increases. The combination of elements 75, 78 acts as a first voltage divider, and the combination of elements 76, 77 acts as a second voltage divider. Therefore, with increasing magnetic field, a voltage at node 79 increases (becomes closer to $U_s$), while a voltage at node 710 decreases (becomes closer to ground). This changes the voltage U1, which is therefore a measure of the applied magnetic field. Such an applied magnetic field in FIG. 7 is represented by a north pole 72 and a south pole 71.

On the other hand, assuming the resistance of all elements 75 to 78 increases in substantially identical manner with temperature (e.g. all elements 75 to 78 have essentially the same temperature coefficient), the voltage U1 is essentially independent from temperature.

Furthermore, a total resistance $R_{tot}$ of sensor 70 is essentially independent of the magnetic field (as for example a decrease of resistance of resistor 75 compensates an increase or resistance of element 78, and a decrease of resistance of element 77 compensates an increase of resistance of element 76), but increases with increasing temperature, as with increasing temperature the resistance of all element 73 to 78 increases.

Therefore, the total resistance $R_{tot}$ represents a measure of the temperature (secondary quantity in the example above), and voltage U1 represents the magnitude of the magnetic field (primary quantity in the example above). In other embodiments, instead of the magnitude of the magnetic field additionally or alternatively a direction of the magnetic field may be sensed. This may for example be used for angular sensors. Consequently, with a sensor like sensor 70, both primary and secondary quantity may be measured using a single sensor arrangement.

Figure 3:
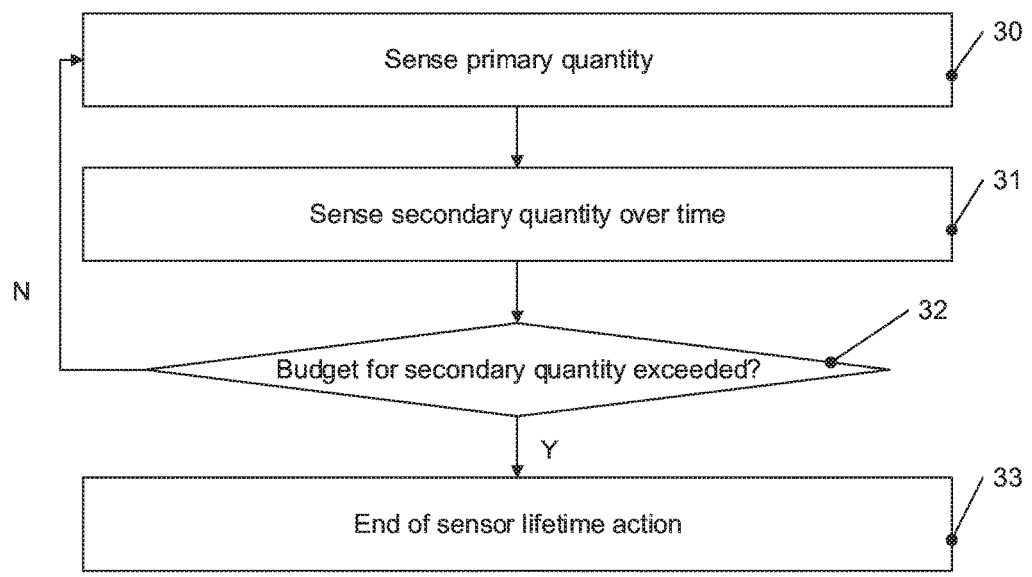
FIG. 3 is a flow chart illustrating a method according to an embodiment.

FIG. 3 illustrates a method according to an embodiment. The method of FIG. 3 may be implemented using the sensor devices of FIG. 1, 2A or 2B or 7 but is not limited thereto and may also be implemented in other sensor devices. Nevertheless, for ease of illustration, the method of FIG. 3 will be described as referring to the devices of FIGS. 1, 2A and 2B. While the method of FIG. 3 will be described as a series of acts or events, the order in which these acts or events are described are not to be construed as limiting. In particular, some of the acts or events described may also be performed in a parallel, for example in different parts of a circuit.

At 30, the method of FIG. 3 comprises sensing a primary quantity, for example using first sensor 11 of sensor device 10 of FIG. 1, using first sensor 21 of sensor device 20 of FIG. 2A or using sensor 25 of sensor device 24 of FIG. 2B. At 31, moreover the method comprises sensing a secondary quantity. The secondary quantity may be a quantity relevant for a lifetime of a sensor device used, and may for example be a temperature, a mechanical stress, a current or a voltage, but is not limited thereto. Sensing the secondary quantity at 31 may for example use second sensor 12 of FIG. 1 or second sensor 22 of FIG. 2A or sensor 25 of FIG. 2B.

At 32, the method comprises checking if the budget for the secondary quantity is exceeded. To this end, a value corresponding to the sensed secondary quantity of 31 may be added to a stored value to increment the same, and at 32 it is then checked if the incremented value exceeds the budget. In addition, at 32 it may also be checked if the incremented value exceeds some warning threshold, and if yes, a corresponding notification may be given to a user. The warning threshold in conveniently smaller than the budget.

If the budget is not exceeded, the method may resume at 30 to continue operation of the sensor. In case the quantity is exceeded, at 33 some end of sensor lifetime action is performed. For example, a user may be requested to exchange the sensor device for a new one, or certain functions relying on the sensor device and the sensed primary quantity may be deactivated.

Figure 4:
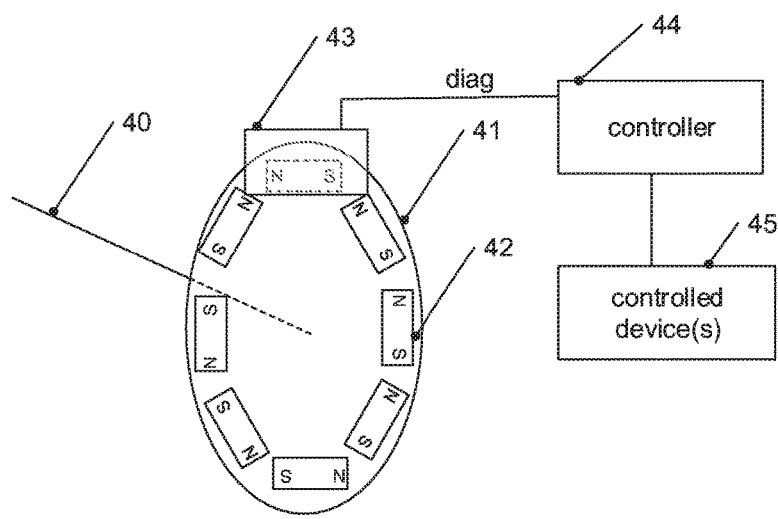
FIG. 4 is a schematic representation of an example environment where sensor devices according to embodiments may be used.

FIG. 4 illustrates an example environment where sensor devices according to some embodiments may be used. In the example environment of FIG. 4, a magnetic field sensor device 43 is used in conjunction with a pole wheel 41 to measure a rotational speed of a shaft 40. Such rotational speed sensors may for example be used in automotive application, where shaft 40 may for example correspond to or be coupled to an rotating shaft of an automobile like cam or crank shaft or a steering wheel of an automobile.

Sensor device 43 may be a sensor device as illustrated with reference to FIG. 1, 2A or 2B. In a particular implementation, sensor device 43 may comprise an XMR sensor arrangement to measure magnetic field and temperature, for example as illustrated with respect to FIG. 7. Sensor device 43 may for example be implemented as shown for sensor device 10 of FIG. 1, sensor device 20 of FIG. 2A or sensor device 24 of FIG. 2B, the respective first sensor (or sensor in case of FIG. 2B) being a magnetic field sensor like an XMR sensor. On pole wheel 41, magnets schematically indicated as 42 are provided to have alternating magnetic poles at the circumference of pole wheel 41. Pole wheel 41 is coupled to shaft 40 such that when shaft 40 rotates, pole wheel 41 also rotates.

When pole wheel 41 rotates, the magnetic field sensed by sensor device 43 changes. Sensor device 43 outputs a signal (for example signal sense of FIG. 1, 2A or 2B) to controller 44, which may determine a rotational speed of shaft 40 based on the sensed magnetic field and control one or more controlled devices 45 (like for example braking systems in an automobile or the like) based on the determination of the rotational speed. Moreover, sensor device 43 may output a diagnosis signal diag as discussed above to controller 44 indicating that a budget of a secondary quantity has been exceeded or is about to be exceeded. Controller 44 may then for example issue a warning to a user or take other appropriate measures like disabling of a certain feature, possibly in conjunction with a warning. For example, controller 44 in FIG. 4 controls a controlled device 45 and may control controlled device 45. In a particular application, controlled device 45 may be an anti-lock breaking system (ABS), and controller 44 may disable anti-lock breaking together with a warning to a driver to have the vehicle serviced.

Figure 5:
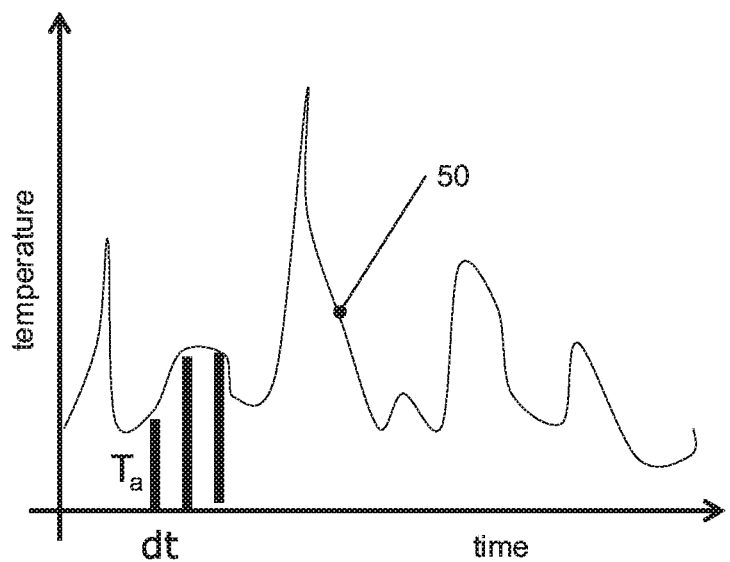
FIGS. 5 and 6 are example diagrams for illustration of operation of some embodiments.
Figure 6:
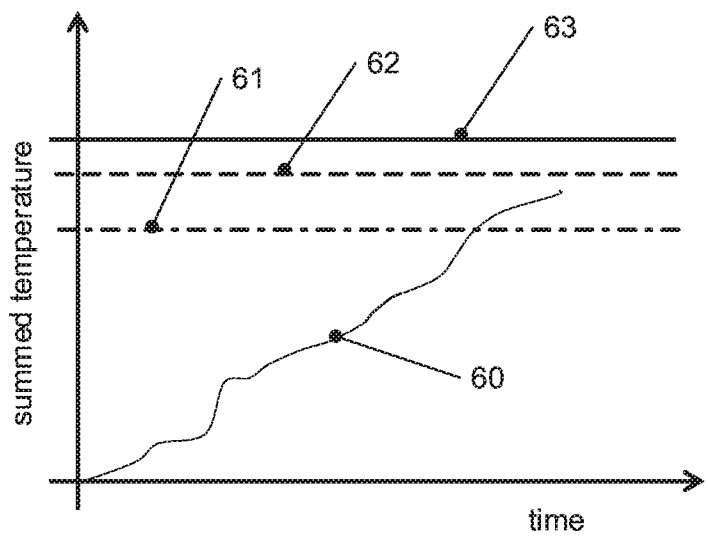

For further illustration, FIGS. 5 and 6 illustrate example temperature curves over time. The use of temperature as a secondary quantity and the exact shape and form of the curves serve merely as illustrative purposes, and other secondary quantities like a strain or a current may also be used, and other curves may apply depending on the use of a particular sensor device.

In FIG. 5, a curve 50 illustrates an example behavior of a temperature measured as a secondary quantity in a sensor device over time. The time scale in FIG. 5 may for example be several hours, several days, several months or even several years. An actual temperature Ta is sampled in time intervals dt, and a stored value is incremented by Ta with every measurement, which corresponds to accumulating the secondary quantity explained above. This essentially corresponds to an integration of the temperature. A resulting curve 60 shows an example for a summed temperature over a time. Typical time scales of FIG. 6 may be several months or several years, but are not limited thereto. The summed temperature of curve 60 may be compared to one or more warning thresholds 61, 62 and a thermal budget threshold 63. Thermal budget threshold 63 corresponds to a thermal budget up to which correct functioning of the sensor device may be guaranteed or expected, whereas when the thermal budget is exceeded correct functioning may no longer be guaranteed. When warning threshold 61, 62, respectively, are exceeded by curve 60 a corresponding warning that the sensor device may soon reach the end of its lifetime may be issued. When the thermal budget 63 is exceeded, for example functions or even complete devices may be deactivated. For example, if the sensor device is used for a safety critical function in an automobile, use of the automobile may even be completely disabled to prevent accidents, depending on the relevance of the function. For example, anti-lock breaking may be disabled together with a warning, as mentioned above.

Please note that as illustrated in FIG. 5 the temperature may be continuously monitored and used for incrementing the summed temperature in regular or irregular intervals. For example, in some embodiments the monitoring may be continuously in regular intervals. In other embodiments, the monitoring may be performed only when the sensor device is active, for example during operation of an automobile where the sensor device is incorporated. It should be noted that the temperature is not only taken into account in the budget in case of an overtemperature (i.e. a temperature exceeding a range for which the sensor device is specified), but also within the specified range, as even when operated within the specified range ageing may occur, which could be modeled using the temperature budget, as explained above.

To give some non-limiting numerical examples, for example a GMR-based wheel speed sensor may have a lifetime of about 10000 hours when operated at a maximum temperature of 125° C., which may reduce to 2500 hours at 160° C. or 500 hours at 107° C. Therefore, while the sensor may be operated at all these temperatures, the actual temperature at which the sensor is operated significantly influences its lifetime. In some embodiments, by monitoring the temperature and the summed temperature, a comparatively precise monitoring of the thermal budget may be provided. In particular, by such monitoring there is no need to assume a worst case scenario for the lifetime, but the actual temperatures the sensors are exposed to may be used, which may in some cases enable sensor devices to be used longer than in cases where a worst case estimation is used.

Some embodiments are implemented according to the following non-limiting examples:

Example 1

A device, comprising:
a sensor to measure a quantity related to a lifetime of the device, and
an evaluation circuit coupled to the sensor to monitor the measured quantity over time to determine if a budget for the quantity is exceeded or about to be exceeded.

Example 2

The device of example 1, wherein the sensor and the evaluation circuit are integrated in a single device.

Example 3

The device of example 1 or 2, wherein the evaluation circuit is configured to sum the quantity over time and to compare the summed quantity to at least one threshold.

Example 4

The device of example 3, wherein the at least one threshold comprises a warning threshold below the budget.

Example 5

The device of example 3 or 4, wherein the at least one threshold comprises a threshold corresponding to the budget.

Example 6

The device of any one of examples 1-5, wherein the quantity is a temperature, and the budget is a thermal budget.

Example 7

The device of any one of examples 1-6, wherein the sensor comprises a magnetoresistive sensor, wherein the quantity is a temperature and wherein the magnetoresistive sensor is further configured to sense a magnetic field and to output a signal representative of the measured magnetic field.

Example 8

The device of any one of examples 1-7, wherein the sensor is further configured to measure a further quantity different from the quantity, and to output a signal representing the further quantity.

Example 9

The device of any one of examples 1-8, wherein the device comprises a further sensor to measure a further quantity, wherein the device is configured to output a signal representing the further quantity.

Example 10

A method comprising:
sensing a quantity using a sensor device,
incrementing a value based on the sensed quantity,
checking if the incremented value exceeds a threshold, and
taking an action depending on the quantity exceeding the threshold.

Example 11

The method of example 10, wherein the quantity is related to a lifetime of the sensor.

Example 12

The method of example 10 or 11, further comprising repeating the method as long as the incremented value does not exceed the threshold.

Example 13

The method of any one of examples 10-12, wherein the threshold comprises at least one of a warning threshold below a budget for the quantity and a threshold corresponding to the budget of the quantity.

Example 14

The method of any one of examples 10-13, wherein the quantity comprises a temperature.

Example 15

The method of any one of examples 10-14, further comprises sensing a further quantity different from the quantity using the sensor device, and outputting a signal representative of the further quantity.

Example 16

The method of example 15, wherein the further quantity comprises a magnetic field.

Example 17

The method of any one of examples 10-16, wherein the action comprises at least one of outputting a warning message or disabling a component associated with the sensor device.

Example 18

A device, comprising:
a magnetoresistive sensor arrangement, the magnetoresistive sensor arrangement being configured to output a first value corresponding to a sensed magnetic field and a second value corresponding to a sensed temperature, and
an evaluation circuit to evaluate the sensed temperature over time.

Example 19

The device of example 18, wherein the magnetoresistive sensor arrangement comprises magnetoresistive sensor elements arranged in a bridge configuration.

Example 20

The device of example 18 or 19, wherein the second value corresponds to an overall resistance of the sensor arrangement, and the first value corresponds to a voltage tapped at nodes between magnetoresistive sensor elements of the sensor arrangement.

Example 21

A device, comprising:
a sensor to measure a quantity related to a lifetime of the device, and
an evaluation circuit coupled to the sensor comprising a storage configured to store the quantity over time.

Example 22

The device of example 21, further comprising an interface to enable reading the stored quantity over time.

As already mentioned, using the temperature above is only an example, and in other devices other secondary quantities may be used. Moreover, in some embodiments also more than a single secondary quantity may be monitored, such that the indefinite article in monitoring "a" secondary quantity is not to be construed as limiting the number of secondary quantities to one.

What is claimed is:

1. A sensor device, comprising:
one or more first sensors configured to measure a primary quantity related to an operation of an entity in which, on which, or near which the sensor device resides, the one or more first sensors arranged on a semiconductor chip;
a second sensor, distinct from the one or more first sensors, the second sensor configured to measure a secondary quantity related to a lifetime of the sensor device, the second sensor arranged on the semiconductor chip, and
an evaluation circuit coupled to the second sensor to monitor the measured secondary quantity over time to determine if a budget for the secondary quantity related to the lifetime of the sensor device is exceeded or about to be exceeded, wherein the secondary quantity is a temperature, and the budget is a thermal budget.

2. The device of claim 1, wherein the second sensor and the evaluation circuit are integrated in a single device.

3. The device of claim 1, wherein the evaluation circuit is configured to sum the secondary quantity over time and to compare the summed secondary quantity to at least one threshold.

4. The device of claim 3, wherein the at least one threshold comprises a warning threshold below the budget.

5. The device of claim 1, wherein the at least one threshold comprises a threshold corresponding to the budget.

6. The device of claim 1, wherein the one or more first sensors comprise a magnetoresistive sensor, and wherein the magnetoresistive sensor is further configured to sense a magnetic field and to output a signal representative of the measured magnetic field as the primary quantity.

7. The device of claim 1, wherein the secondary quantity measured by the secondary sensor is a quantity type that is different from a quantity type of the primary quantity.

8. A method employed by a sensor device, comprising:
sensing a primary quantity using one or more first sensors arranged on a semiconductor chip, wherein the primary quantity is related to an operation of an entity in which, on which, or near which the sensor device resides,
sensing a secondary quantity using a second sensor arranged on the semiconductor chip, wherein the one or more first sensors and the second sensor are distinct from one another, wherein the secondary quantity is related to a lifetime of the sensor device,
incrementing a value based on the sensed secondary quantity using an evaluation circuit,
checking if the incremented value exceeds a threshold using the evaluation circuit, and
taking an action by selectively outputting a warning message or an alarm signal, or selectively disabling the sensor device depending on the value exceeding the threshold, wherein the primary quantity comprises a magnetic field.

9. The method of claim 8, further comprising repeating the method as long as the incremented value does not exceed the threshold.

10. The method of claim 8, wherein the threshold comprises at least one of a warning threshold below a budget for the secondary quantity and a threshold corresponding to the budget of the secondary quantity.

11. The method of claim 8, wherein the secondary quantity comprises a temperature.

12. A device, comprising:
a magnetoresistive sensor arrangement, the magnetoresistive sensor arrangement being configured to output a first value at a first one or more terminals corresponding to a sensed magnetic field and a second value at a second one or more terminals corresponding to a sensed temperature, wherein the first one or more terminals is different from the second one or more terminals, and
an evaluation circuit configured to evaluate the sensed temperature over time and make a determination regarding a lifetime of an entity in which, on which, or near which the device resides,
wherein the magnetoresistive sensor arrangement comprises magnetoresistive sensor elements arranged in a bridge configuration,
wherein the second value corresponds to an overall resistance of the sensor arrangement, and the first value corresponds to a voltage tapped at two first terminals in first and second branches between series-connected magnetoresistive sensor elements, in each branch of the sensor arrangement arranged in a full bridge configuration.

13. A device, comprising:
one or more first sensors configured to measure a primary quantity related to an operation of an entity in which, on which, or near which the device resides;
a second sensor, distinct from the one or more first sensors, the second sensor configured to measure a secondary quantity related to a lifetime of the device, wherein the secondary quantity comprises a temperature, and
an evaluation circuit coupled to the second sensor comprising a storage configured to store the secondary quantity over time.

14. The device of claim 13, further comprising an interface to enable reading the stored secondary quantity over time.

* * * * *